United States Patent
Nasta

(10) Patent No.: US 9,429,984 B2
(45) Date of Patent: Aug. 30, 2016

(54) SYSTEM AND METHOD FOR IMPROVING ACCURACY OF MEASUREMENTS OF A NETWORK OF INTELLIGENT POWER DISTRIBUTION UNITS THROUGH TIME SYNCHRONIZATION

(71) Applicant: Raritan Americas, Inc., Somerset, NJ (US)

(72) Inventor: Bunty Nasta, Iselin, NJ (US)

(73) Assignee: Raritan Americas, Inc., Somerset, NJ (US)

( * ) Notice: Subject to any disclaimer, the term of this patent is extended or adjusted under 35 U.S.C. 154(b) by 332 days.

(21) Appl. No.: 14/011,848

(22) Filed: Aug. 28, 2013

(65) Prior Publication Data
US 2014/0281598 A1    Sep. 18, 2014

Related U.S. Application Data

(60) Provisional application No. 61/793,390, filed on Mar. 15, 2013.

(51) Int. Cl.
*G06F 1/26* (2006.01)
*G06F 1/32* (2006.01)
*G06F 1/12* (2006.01)
*G06F 1/14* (2006.01)
*H05K 7/14* (2006.01)

(52) U.S. Cl.
CPC . *G06F 1/12* (2013.01); *G06F 1/14* (2013.01); *G06F 1/26* (2013.01); *H05K 7/1457* (2013.01)

(58) Field of Classification Search
CPC .............. G06F 1/12; G06F 1/14; G06F 1/26
USPC ................................ 713/300, 320, 330, 340
See application file for complete search history.

(56) References Cited

U.S. PATENT DOCUMENTS

2010/0280774 A1* 11/2010 Ewing ..................... H04Q 9/00
                                                          702/60

* cited by examiner

*Primary Examiner* — Michael J Brown
(74) *Attorney, Agent, or Firm* — Mark H. Jay

(57) ABSTRACT

In an energy management system for a data center, intelligent power distribution units are synchronized by a time server. Measurements carried out by the intelligent power distribution units are commenced and stopped synchronously. Each intelligent power distribution unit carries out a calculation based upon the Unix Epoch Time of receipt of a sampling command from the energy management system.

18 Claims, 5 Drawing Sheets

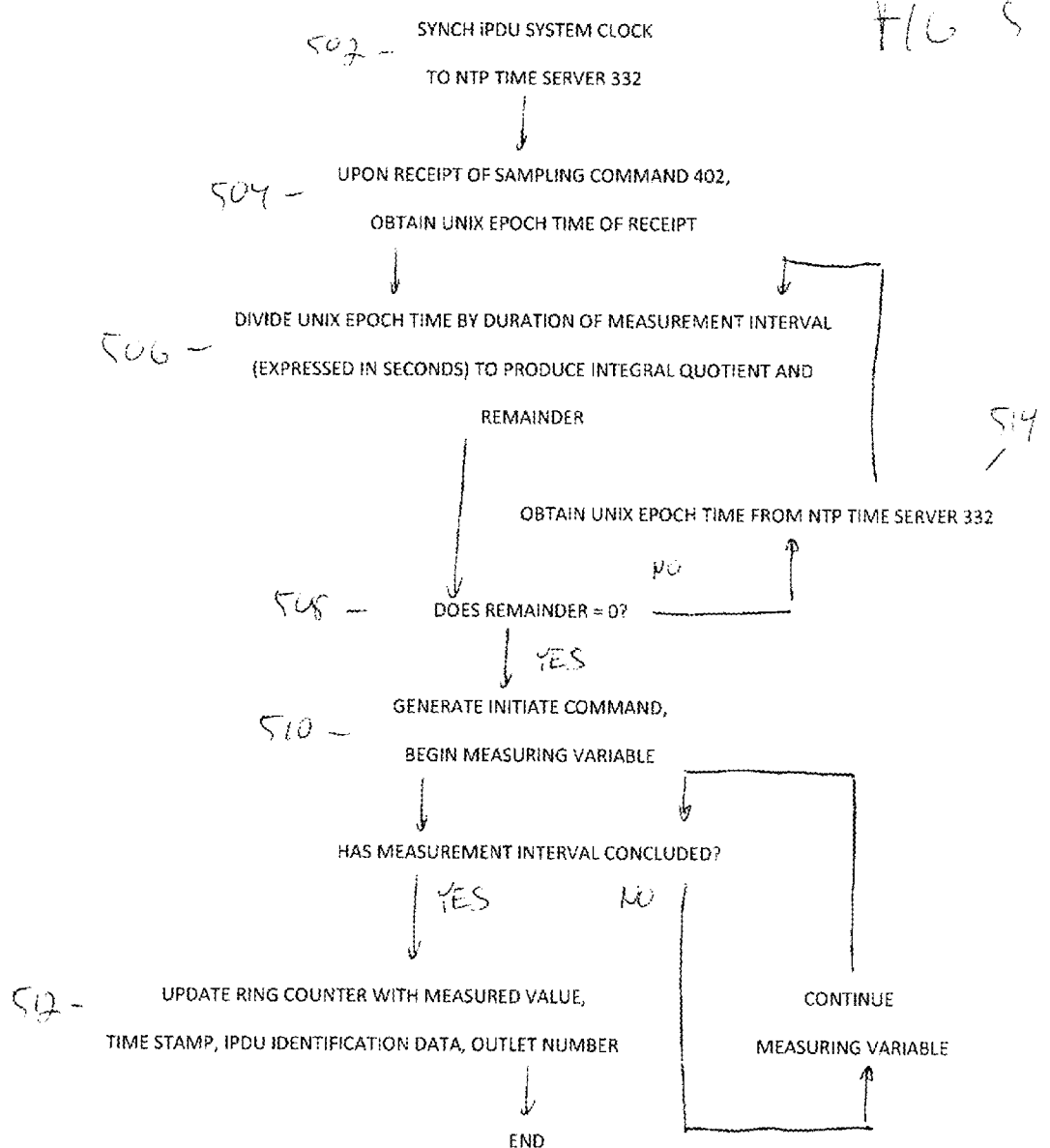

SYSTEM AND METHOD FOR IMPROVING ACCURACY OF MEASUREMENTS OF A NETWORK OF INTELLIGENT POWER DISTRIBUTION UNITS THROUGH TIME SYNCHRONIZATION

BACKGROUND OF THE INVENTION

The invention relates to the improvement of measurement accuracy in a network of intelligent power distribution units. More specifically, the invention relates to improving the comparability of current, voltage or power measurements carried out by intelligent power distribution units in a network. In its most immediate sense, the invention relates to improved synchronization of measurements carried out by networked intelligent power distribution units.

A data center is a facility housing computer systems in standardized racks. Each rack will contain one or more discrete electronic components (such as servers, switches, storage devices, power supplies, and others) that are vertically stacked. A rack unit or U (less commonly RU) is a unit of measure used to describe the vertical position of an electronic component within a standard-sized rack. One rack unit is 1.75 inches in height, and the physical location of an electronic component within the data center is typically specified by identifying the number of the rack in which the electronic component is mounted together with the a rack vertical number that identifies the vertical position of the electronic component within that rack (for example, a component may be located at a 7 U position).

Intelligent Power Distribution Units ("iPDUs") are used in data centers to distribute power to the discrete electronic components. In a typical data center, power runs from a UPS, to a transformer, to a floor or wall PDU to a rack PDU such as an iPDU. Each iPDU has a plurality of female line power outlets, making it possible to supply power to a like plurality of electronic components.

The iPDUs are referred to as "intelligent" because they can typically connected to a network and are capable of sending information and receiving commands. For example, an iPDU may communicate via the Simple Network Management Protocol ("SNMP") over a network. Additionally an iDPU can typically collect data regarding current, voltage and/or power at the unit or outlet level. Conventionally, a data center operator notes the location (rack number, rack vertical number) of each electronic component in the data center and also notes the particular iPDU and outlet that supply power to that electronic component. Thus the operator of the data center can monitor the power consumption of each electronic component in the data center by collecting current, voltage, and/or power data at the corresponding iPDU and outlet and sending this information to an energy management system.

FIG. 1 shows a prior art data center system 100. It include PowerIQ® server 102. PowerIQ is an energy management software application. It allows the system administrator of a data center to collect data from the many iPDUs in the data center, to analyze that data, and to send commands to the iPDUs over an SNMP network 128. PowerIQ may be a separate server appliance 102 as shown, or may run as an application on a server. Rack 104 is shown with servers 106, 108, and 110 mounted in it. iPDU 112 (shown separated from the rear of the rack 104 for clarity) supplies power to the servers 106, 108, and 110. Data connection 114 is connected to network 128, which is in turn connected by data connection 130 to PowerIQ server 102. Similarly, rack 116 is shown with severs 118, 120, and 122 mounted in it. iPDU 124 (shown separated from the rear of the rack 124 for clarity) supplies power to the servers 118, 120, and 122. Data connection 126 is connected to network 128. Although for illustrative purposes only two racks are shown in FIG. 1, a data center can contain thousands of racks and iPDUs, and tens of thousands of electronic components.

FIG. 2 of the present application shows the functioning of the prior art system shown in FIG. 1. If a user of the PowerIQ energy management system wishes to collect data from a set of iPDUs, the PowerIQ server 102 will issue a command to those iPDUs. (For simplicity, FIG. 2 considers only two iPDUs, specifically iPDUs 112 and 124.) The command will specify the measurement to be carried out and the duration of the measurement. Common measurements are:

average current consumption during a predetermined interval;
minimum current consumption during a predetermined interval;
maximum current consumption during a predetermined interval;
instantaneous current consumption at the end of a predetermined interval;
average voltage during a predetermined interval;
minimum voltage during a predetermined interval;
maximum voltage during a predetermined interval;
instantaneous voltage at the end of a predetermined interval;
average power consumption during a predetermined interval;
minimum power consumption during a predetermined interval;
maximum power consumption during a predetermined interval;
instantaneous power consumption during a predetermined interval;

and a typical measurement duration is 300 seconds (although measurement durations can be as short as XXXXXX seconds and as long as YYYYY seconds).

FIG. 2 shows PowerIQ server 102 issuing sampling command 202 over the network 128. In the illustrative example of FIG. 2, the sampling command 202 is received by iPDU 124 at time 218, which is before time 208, which is when the sampling command 202 is received by iPDU 112. This time difference ("skew") can come about as a result of factors well understood to those skilled in the networking arts, such as distance, bandwidth, traffic, etc. At time 208 iPDU 112 begins to measure the variable whose trace is shown as trace 204. The variable could be current, voltage or power. During the interval 210 the iPDU measures this variable, and at the end of interval 210, the iPDU then stores in a ring buffer the measured average, minimum, maximum or instantaneous value of that variable, together with a time stamp, iPDU identification data, and the outlet number if outlet level metering is being used. Similarly, at time 218 iPDU 124 begins to measure the variable whose trace is shown as trace 206. This likewise could be current, voltage or power, but in the present example the sampling command 202 commands both the iPDUs 112, 124 to carry out the same measurement. During the interval 220 the iPDU 124 measures this variable, and at the end of interval 220, the iPDU then stores the measured data in a ring buffer together with a time stamp, iPDU identification data, and the outlet number if outlet level metering is being used.

The skew between time 208 and time 218 causes inconsistency in the measurements carried out by the iPDUs 112, 124 and therefore makes the measurements carried out by the iPDUs 112, 124 non-comparable. For example, if the iPDUs 112, 124 were commanded to measure maximum current, then during the intervals 210 and 220 the iPDUs 112, 124 would record different maximum currents even when (as illustrated) the currents measured vary identically with time. This can be understood because the current peak 228 is within the first interval 210 carried out by iPDU 112 and the corresponding current peak 230 is not within the interval 220 carried out by iPDU 124. Thus, the skew between time 208 and time 218 causes a comparison of the maximum current measured by the iPDU 112 with the maximum current measured by the iPDU 124 to have only a limited significance.

Further, even if the iPDUs 112, 124 received the sampling command 202 at the same time (i.e. even if the skew between times 208 and 218 were to be zero) the apparent synchrony indicated by the time stamps sent to the PowerIQ energy management system would not be meaningful. This is because the two iPDUs 112, 124 are not synchronized with each other and identical time stamps from these two iPDUs 112, 124 would not in fact indicate that they received the sampling command 202 simultaneously.

The PowerIQ energy management system periodically polls the ring buffer of each iPDU such as the iPDUs 112, 124. As shown in FIG. 2, the PowerIQ energy management system begins to poll the iPDUs at time 232, continues polling during interval 236, and concludes polling at time 234.

There remains a need in the art to improve the synchronization of measurements made by the iPDUs monitored by an energy management system so that comparisons between the data measured by the iPDUs are meaningful.

SUMMARY OF THE INVENTION

In one or more specific embodiments, the invention provides for system and method for improving accuracy of measurements of a network of intelligent power distribution units through time synchronization.

BRIEF DESCRIPTION OF THE DRAWINGS

For the purposes of illustration, there are forms shown in the drawings that are presently preferred, it being understood, however, that the invention is not limited to the precise arrangements and instrumentalities shown.

FIG. 5 is a flow chart schematically illustrating operation of an embodiment of the present invention.

DETAILED DESCRIPTION OF PREFERRED EMBODIMENTS

Figure 1:
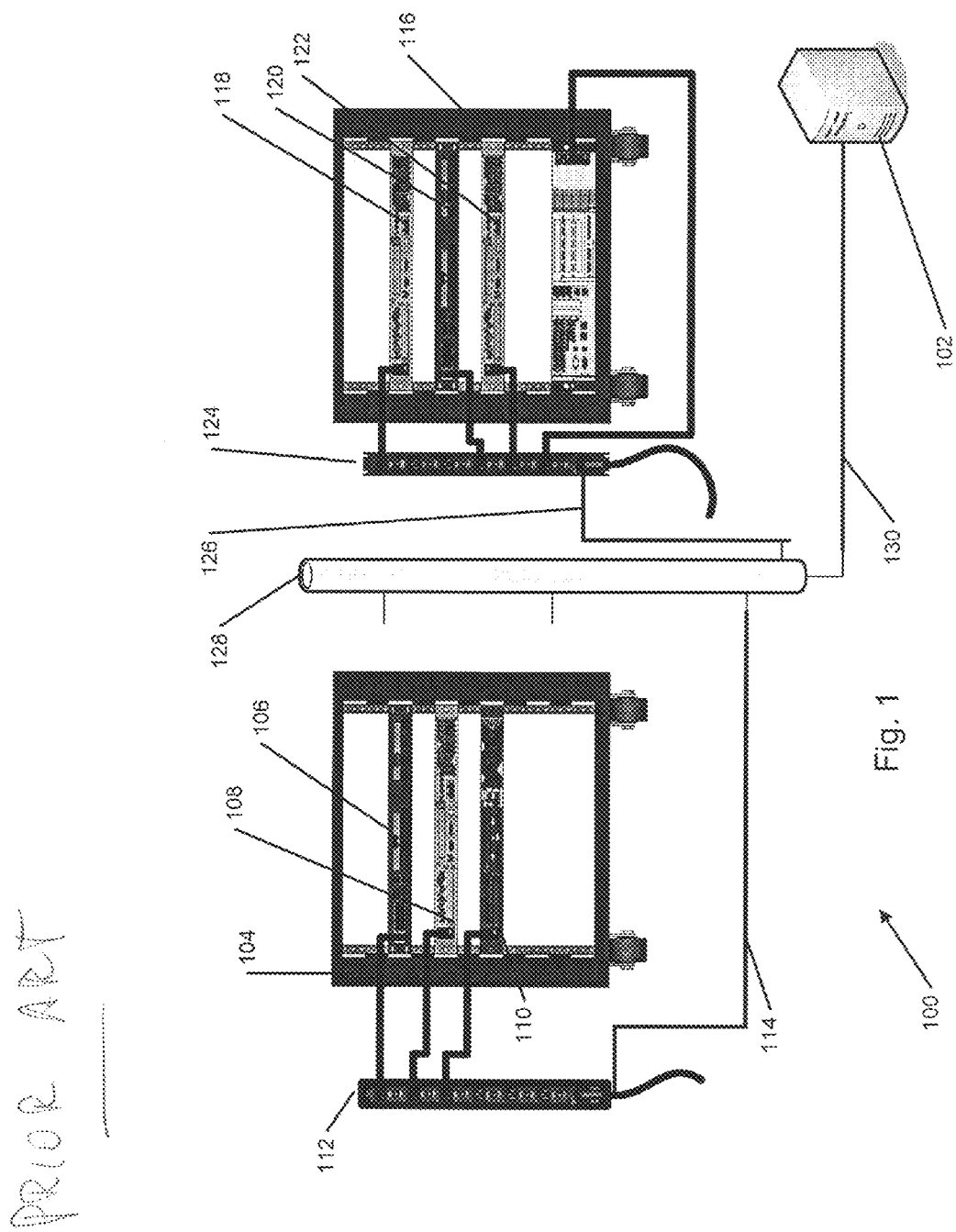
FIG. 1 schematically illustrates a prior art data center system.
Figure 2:
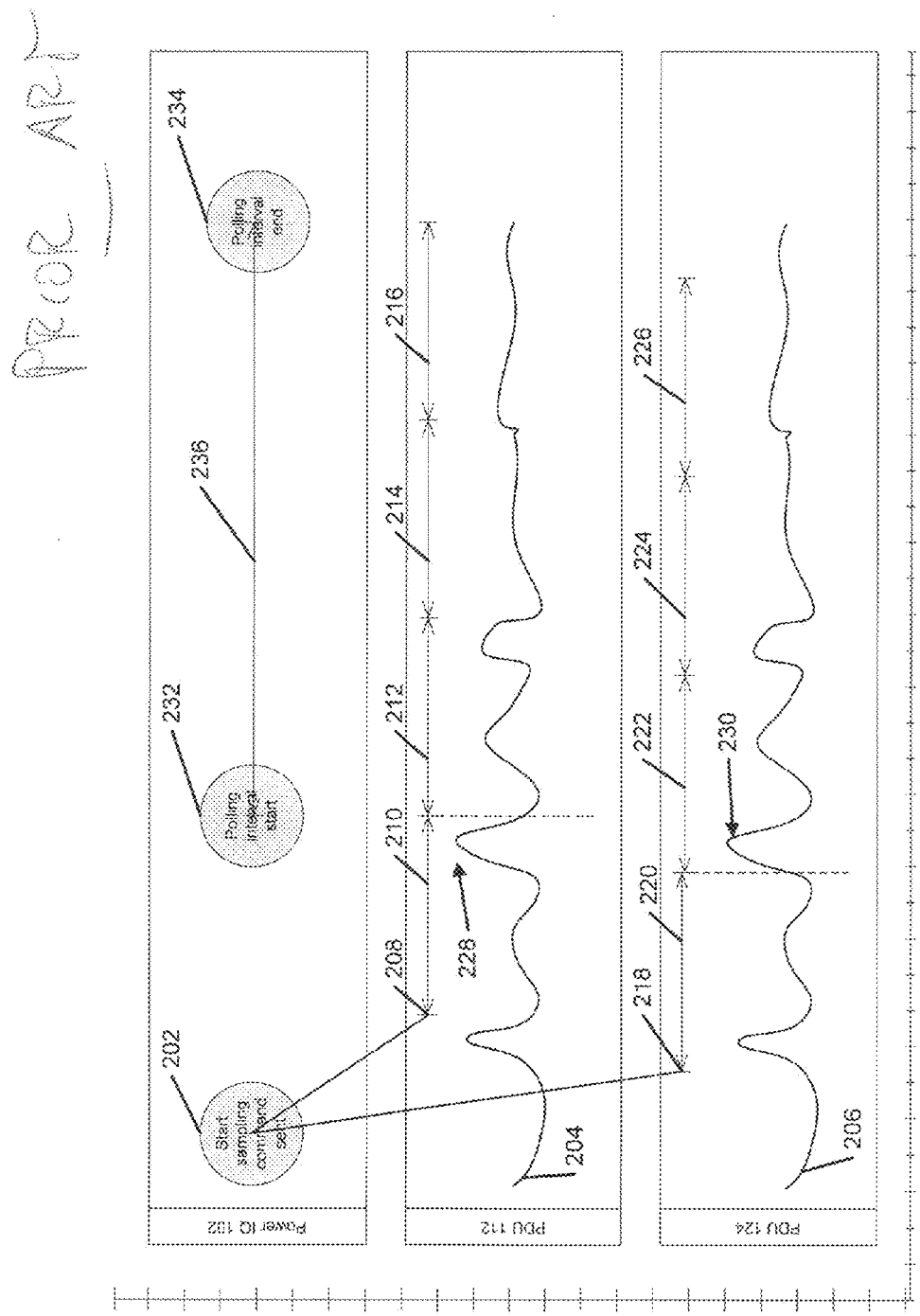
FIG. 2 schematically illustrates the timing of the operation of a prior art energy management system.
Figure 3:
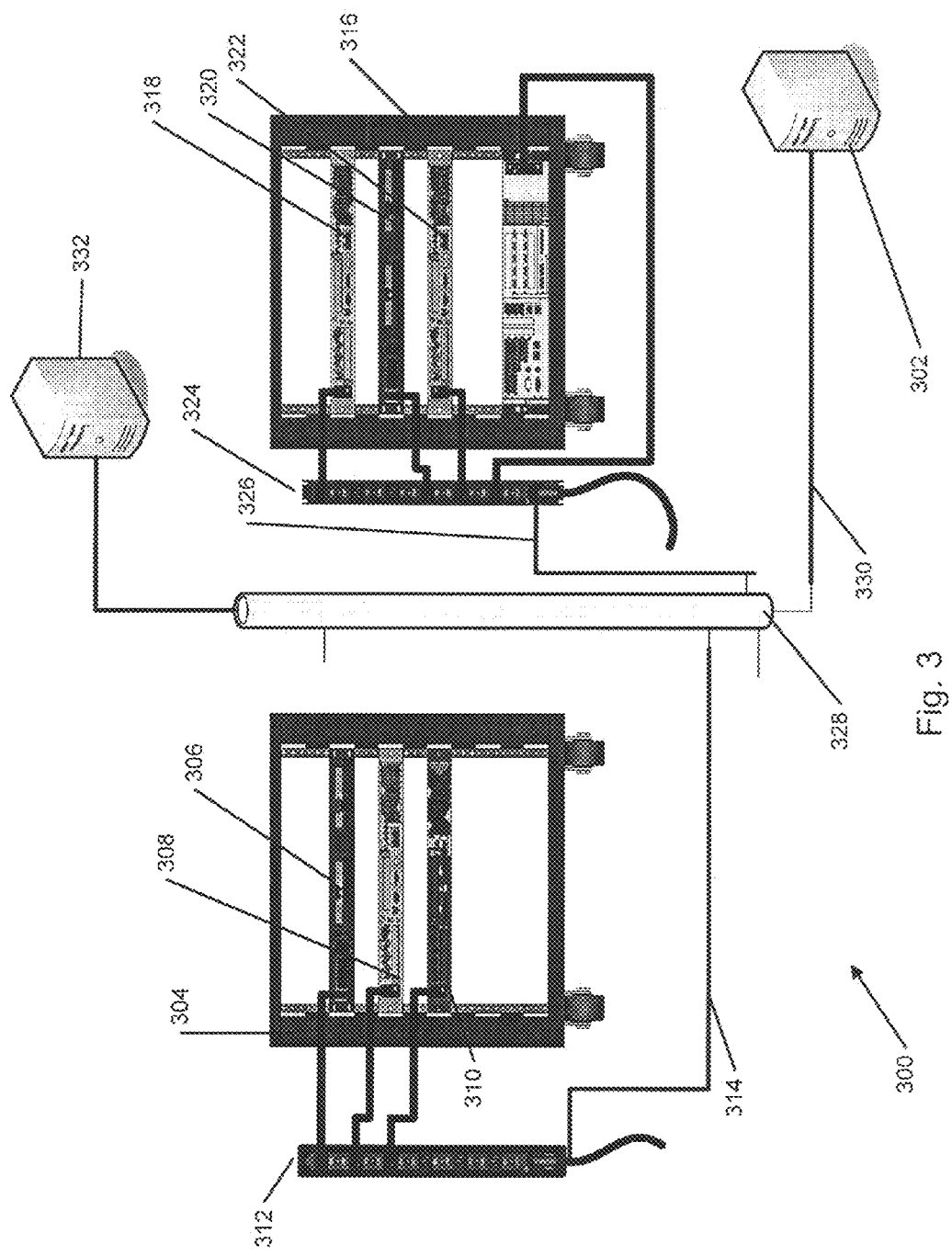
FIG. 3 schematically illustrates a data center system in accordance with an embodiment of the present invention.

FIG. 3 schematically illustrates data center system 300 that includes an embodiment of the present invention. It includes PowerIQ® server 302. Rack 304 is shown with servers 306, 308, and 310 mounted in it. iPDU 312 (shown separated from the rear of the rack 304 for clarity) supplies power to the servers 306, 308, and 310. Data connection 314 is connected to network 328, which is in turn connected by data connection 330 to PowerIQ server 302. Similarly, rack 316 is shown with severs 318, 320, and 322 mounted in it. iPDU 324 (shown separated from the rear of the rack 316 for clarity) supplies power to each of the servers 318, 320, and 322. Data connection 326 is connected to network 328. Further, NTP time server 332 is connected to network 328. Although for illustrative purposes two racks are shown in FIG. 2, a data center including an embodiment of the present invention can contain many thousands of racks and iPDUs, and tens of thousands of electronic components.

NTP time server 332 is a time server. A time server is a server computer that reads the actual time from a reference clock and distributes this information to its clients using a network. The time server may be a local network time server or an internet time server. The most important and widely-used protocol for distributing and synchronising time over the Internet is the Network Time Protocol (NTP), though other less-popular or outdated time protocols continue to be in use. A variety of protocols are in common use for sending time signals over radio links and serial connections. The time reference used by a time server could be another time server on the network or the Internet, a connected radio clock or an atomic clock. An existing network server (e.g. a file server) can become a time server with additional software. The NTP homepage provides a free and widely-used reference implementation of the NTP time server and client for many popular operating systems. Alternatively, a time server can be implemented using a dedicated time server device. In accordance with a preferred embodiment of the present invention the NTP time server 332 is not its own dedicated server. The NTP time server 332 can be connected to iPDUs 312 or 324 and the PowerIQ server 302 through the network 328 or via a separate network. NTP time servers are very well known in the networking art. The NTP time server 332 allows the system clocks of the iPDUs 312, 324 to be synchronized within a few tens of milliseconds. This time synchronization is a prerequisite to synchronizing measurements carried out by the iPDUs 312, 324.

Figure 4:
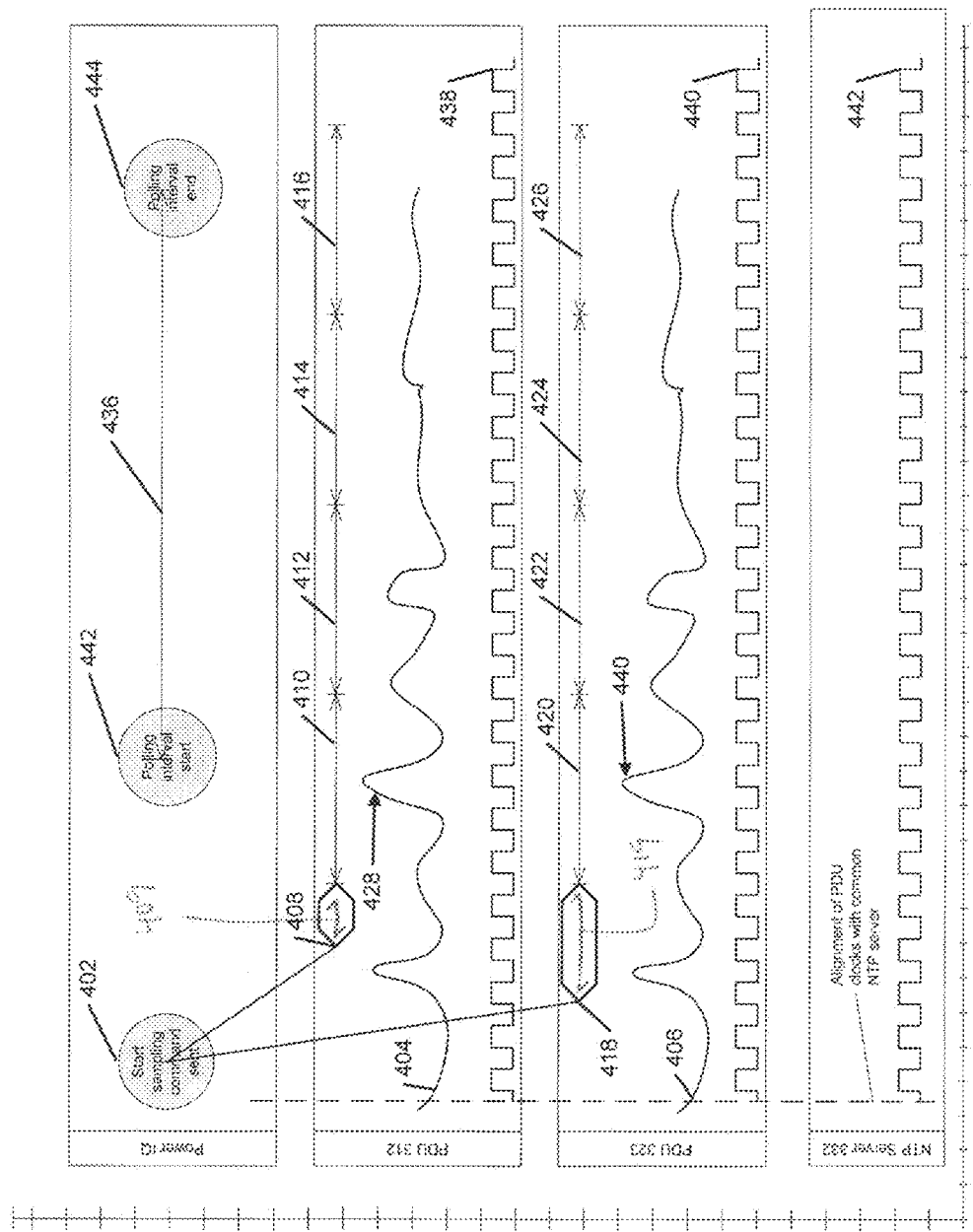
FIG. 4 schematically illustrates the timing the operation of an energy management system in accordance with an embodiment of the present invention.

As shown by the time signals 438, 440, and 442 in FIG. 4, the NTP time server 332 synchronizes the system clocks of the iPDU 312 (signal 438) and the iPDU 323 (signal 440). PowerIQ server 304 issues sampling command 402 over the network 328. FIG. 4 shows that the sampling command 402 is received by iPDU 314 at time 418 before the sampling command 402 is received by iPDU 312 at time 408. This skew can come about as a result of factors well understood to those skilled in the networking arts, such as distance, bandwidth, traffic, etc.

In accordance with the preferred embodiment of the invention, receipt of the sampling command 402 does not itself cause the iPDUs 312, 323 to begin measurement operations. Rather, the time at which an iPDU registers receipt of the sampling command 402 is used in a calculation that determines whether measurement of the variable of interest will begin. At time 408, iPDU 312 begins to wait for a wait period 409 (discussed in more detail below). At the end of wait period 409, which is the beginning of the interval 410 in which measurement of the variable of interest occurs, an initiate command generated internally within iPDU 312 causes measurement of the variable whose trace is shown as trace 404 to begin. The variable, which is determined by the sampling command 402, could be current, voltage or power. During the interval 410 the iPDU 312 monitors this variable, and at the end of interval 410, the iPDU 312 then stores in a ring buffer the average, minimum, maximum or instantaneous value of that variable (as commanded by the sampling command 402), together with a time stamp, iPDU identification data, and the outlet number if outlet level metering is being used. Similarly, at time 418 iPDU 324 begins to wait for wait period 419. (As will be discussed below, the wait period 409 and the wait period 419 are not of identical duration.) At the end of wait period 419, which is the beginning of the interval 420 in which measurement of the variable of interest occurs, an initiate command generated internally within iPDU 323 causes measurement of the variable whose trace is shown as trace 406 to begin. This variable, which is determined by the sampling command 402, could be current, voltage or power, and in the preferred embodiment of the invention the sampling command 402 causes all iPDUs that receive it to measure the same variable. During the interval 420 the iPDU monitors this variable, and at the end of interval 420, the iPDU then stores in a ring buffer the average, minimum, maximum or instantaneous value of that variable (as commanded by the sampling command 402), together with a time stamp, iPDU identification data, and the outlet number if outlet level metering is being used.

The wait periods 409 and 419 are determined such that the sample intervals 410 and 420 start and end at the same time. Each of the wait periods 409, 419 is generated within the corresponding iPDU 312, 323 by a calculation shown in FIG. 5. As previously discussed, the system clocks of the iPDUs 312, 323 are synchronized by the time server 332, and this is carried out in step 502. This synchronization is constantly updated in accordance with whatever protocol is executed by the time server 332, but this updating is not part of the invention. In step 504, each iPDU 312, 323 gets the time T of receipt of the sampling command 502 from its own system clock. In step 506 a calculation is carried out. In a preferred embodiment of the invention, the Unix Epoch Time (the number of seconds since GMT midnight of Jan. 1, 1970) of receipt of the sampling command is divided by the duration of the desired measurement interval to produce an integer and a remainder. In step 508, each iPDU 312, 323 determines whether the remainder is zero. If so, then the iPDU 312, 323 generates an initiate command to begin measuring the variable of interest (step 510). Measurement then begins for a predetermined measurement interval (advantageously 300 seconds) and at the end of that interval the quantity of interest (e.g. the average, minimum, or maximum value of the current, voltage, or power or the instantaneous value of the current, voltage or power at the end of the measurement interval) is registered, along with a time stamp, iPDU identification data, and the outlet number if outlet level metering is being used (step 512). If not, one second later the iPDU 312, 323 obtains the Unix Epoch Time from the NTP time server 332 (step 514) and repeats the calculation once each second until a remainder of zero is produced, at which time the same information is registered. Unix code implementing the preferred embodiment of the invention is:

```
#define OPTIMIZED_SYNC_SLEEP_BUFFER 5
#define OPTIMIZED_SNAPSHOT_SLEEP_BUFFER 2
#define WAIT_TIME_BETWEEN_SYNC_IN_US 500000
int syncWithEpochTime(long snapshot_timer_frequency) {
    /* sync the collection time here...
       Wait for the time when the epoch time becomes a multiple of the
sampling period
       This will make sure that all the PXs that have the same sampling
       period and date-time will sample at the same epoch time
    */
    int time _synced = 0;
```

-continued

```
    /* optimized sleep -start */
    long epoch_time = time(NULL);
    long sleep_time = snapshot_timer_frequency - ((epoch_time +
snapshot_timer_frequency) % snapshot_timer_frequency);
    if (sleep_time > OPTIMIZED_SYNC_SLEEP_BUFFER) {
        sleep(sleep_time - OPTIMIZED_SYNC_SLEEP_BUFFER);
    }
    /* optimized sleep -end */
    epoch_time = time(NULL);
    while(epoch_time % snapshot_timer_frequency ) {
        /* reason we wait for half sec here is because the epoch time
should be hit 500ms
           earlier. We assume half sec is enough for the processing to
           collect the sample
           Reduce this time if the processing time is longer */
        usleep(WAIT_TIME_BETWEEN_SYNC_IN_US);
        epoch_time = time(NULL);
    }
    /* 'start time' sync complete... */
    elapsed = snapshot_timer_frequency;
    time_synced = 1;
    PPD_DEBUG("data collection synced at epoch time %Id\n",
epoch_time);
    return time_synced;
}
```

Thus, in accordance with the preferred embodiment of the invention, measurement of the variable of interest by each iPDU will always begin and end at the same Unix Epoch Time, whereby the quantities measured by different iPDUs will always be comparable.

Although it is presently preferred to divide the Unix Epoch Time of receipt of the sampling command by the duration in seconds of the measurement interval, this is not necessary and any other divisor can be used instead. So, too, although it is presently preferred that the remainder of the calculation be zero, this is also unnecessary and any other remainder can be used instead.

Although the invention herein has been described with reference to particular embodiments, it is to understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:
1. An intelligent power distribution unit, comprising:
   a. a plurality of female line power outlets, each adapted for supplying power to a rack-mounted component connected thereto;
   b. means for measuring, in response to an initiate command and during a predetermined measurement interval, a predetermined characteristic of electrical energy delivered to each rack-mounted component that is connected to one of the female line power outlets;
   c. means for receiving a sampling command from a control system; and
   d. means for generating, subsequent to receipt of the sampling command, and at a time when the Unix Epoch Time of receipt of the sampling command is divisible by a known quantity to produce an integer and a predetermined remainder, the initiate command.

2. The intelligent power distribution unit of claim 1, wherein the known quantity is the duration in seconds of the predetermined measurement interval.

3. The intelligent power distribution unit of claim 1, wherein the predetermined remainder is zero.

4. The intelligent power distribution unit of claim 1, wherein said means for measuring comprises means for measuring at least one of the following quantities:
   a. average current consumption during the predetermined measurement interval;
   b. minimum current consumption during the predetermined measurement interval;
   c. maximum current consumption during the predetermined measurement interval;
   d. instantaneous current at the end of the predetermined measurement interval;
   e. average voltage during the predetermined measurement interval;
   f. minimum voltage during the predetermined measurement interval;
   g. maximum voltage during the predetermined measurement interval;
   h. instantaneous voltage at the end of the predetermined measurement interval;
   i. average power consumption during the predetermined measurement interval;
   j. minimum power consumption during the predetermined measurement interval; and
   k. maximum power during the predetermined measurement interval; and
   l. instantaneous power consumption during the predetermined measurement interval.

5. The intelligent power distribution unit of claim 1, further comprising means for reporting said predetermined characteristic to the control system.

6. An intelligent power distribution unit, comprising:
   a. a line power supply cable terminating in a male plug;
   b. a plurality of female line power outlets, each adapted for supplying power to a rack-mounted component connected thereto;
   c. a network connection for receiving commands from a control system and for transmitting measured information thereto;
   d. means for measuring, in response to an initiate command and during a predetermined measurement interval, a predetermined characteristic of electrical energy delivered to each rack-mounted component that is connected to one of the female line power outlets;
   e. means for receiving from the control system, via the network connection, a sampling command from a control system;
   f. means for generating, subsequent to receipt of the sampling command, and at a time when the Unix Epoch Time of receipt of the sampling command is divisible by a known quantity to produce an integer and a predetermined remainder, the initiate command; and
   g. means for transmitting to the control system, via the network connection, measured information from said measuring means.

7. The intelligent power distribution unit of claim 6, wherein the known quantity is the duration in seconds of the predetermined measurement interval.

8. The intelligent power distribution unit of claim 6, wherein the predetermined remainder is zero.

9. The intelligent power distribution unit of claim 6, wherein said means for transmitting transmits to the control system:
   a. a time stamp;
   b. a measurement of a predetermined characteristic of electrical energy during a predetermined measurement interval; and
   c. an identification of the intelligent power distribution unit that measured the predetermined characteristic of electrical energy.

10. The intelligent power distribution unit of claim 9, wherein said means for transmitting transmits an identification of the female line power outlet from which the predetermined characteristic of electrical energy was measured.

11. The intelligent power distribution unit of claim 6, wherein each initiate command from the control system identifies a particular predetermined characteristic of electrical energy to be measured from a set of available predetermined characteristics of electrical energy.

12. The intelligent power distribution unit of claim 10, wherein the set of available predetermined characteristics of electrical energy includes:
   a. average current consumption during the predetermined measurement interval;
   b. minimum current consumption during the predetermined measurement interval;
   c. maximum current consumption during the predetermined measurement interval;
   d. instantaneous current at the end of the predetermined measurement interval;
   e. average voltage during the predetermined measurement interval;
   f. minimum voltage during the predetermined measurement interval;
   g. maximum voltage during the predetermined measurement interval;
   h. instantaneous voltage at the end of the predetermined measurement interval;
   i. average power consumption during the predetermined measurement interval;
   j. minimum power consumption during the predetermined measurement interval; and
   k. maximum power during the predetermined measurement interval; and
   l. instantaneous power consumption during the predetermined measurement interval.

13. An energy management system for use in data centers and like facilities wherein a multiplicity of rack-mounted components are supplied with power by a plurality of intelligent power distribution units, comprising:
   a. a plurality of intelligent power distribution units of claim 1 or 6;
   b. a time server operatively connected to each of the intelligent power distribution units;
   c. a control system issuing initiate commands and receiving measured predetermined characteristics of electrical energy delivered to identified rack-mounted components; and
   d. a network connecting the intelligent power distribution units and the control system.

14. The energy management system of claim 13, wherein the network operatively connects that time server to the intelligent power distribution units.

15. A method of synchronizing the operation of a plurality of slaved devices that are connected to a control system that issues operation commands to the slaved devices over a network, wherein each of the slaved devices is required to carry out an operation after receipt of an operation command, comprising:
   a. supplying each of the slaved devices with Unix Epoch Time;
   b. issuing an operation command to at least two of the slaved devices over the network;

c. causing each of the slaved devices, upon its receipt of an operation command, to carryout a calculation in which the Unix Epoch Time of receipt of the sampling command is divided by a known quantity to produce an integral quotient and a remainder; and d. causing each slaved device to carryout an operation only if the remainder equals a predetermined number.

16. The method of claim 15, further comprising the step of repeating step 15.c until the remainder equals the predetermined number.

17. The method of claim 16, wherein the predetermined number is zero.

18. A method of synchronizing the operation of a plurality of slaved devices that are connected to a control system that issues operation commands to the slaved devices over a network, wherein each of the slaved devices is required to carry out an operation after receipt of an operation command, comprising:

a. supplying each of the slaved devices with Unix Epoch Time;

b. issuing an operation command to at least two of the slaved devices over the network;

c. causing each of the slaved devices, upon its receipt of an operation command, to carry out a calculation based upon the Unix Epoch Time of receipt of the sampling command; and d. causing each slaved device to carryout an operation only if the calculation meets predetermined criteria.

* * * * *